United States Patent
Dorfman et al.

(10) Patent No.: US 10,324,782 B1
(45) Date of Patent: Jun. 18, 2019

(54) HICCUP MANAGEMENT IN A STORAGE ARRAY

(71) Applicant: EMC Corporation, Hopkinton, MA (US)

(72) Inventors: Eli Dorfman, Raanana (IL); Tal Ben-Moshe, Kiryat Ono (IL); David Krakov, Ramat Gan (IL); Noa Cohen, Tel Aviv (IL); Niko Farhi, Petah-Tikva (IL); Roman Vainbrand, Kfar Saba (IL)

(73) Assignee: EMC Corporation, Hopkinton, MA (US)

( * ) Notice: Subject to any disclaimer, the term of this patent is extended or adjusted under 35 U.S.C. 154(b) by 91 days.

(21) Appl. No.: 15/079,205

(22) Filed: Mar. 24, 2016

(51) Int. Cl.
*G06F 11/00* (2006.01)
*G06F 11/07* (2006.01)
*G11C 29/52* (2006.01)

(52) U.S. Cl.
CPC ........ *G06F 11/079* (2013.01); *G06F 11/0727* (2013.01); *G06F 11/0757* (2013.01); *G06F 11/0793* (2013.01); *G11C 29/52* (2013.01)

(58) Field of Classification Search
CPC ............... G06F 11/079; G06F 11/0727; G06F 11/0757; G06F 11/0793
See application file for complete search history.

(56) References Cited

U.S. PATENT DOCUMENTS

| | | |
|---|---|---|
| 5,204,958 A | 4/1993 | Cheng et al. |
| 5,453,998 A | 9/1995 | Dang |
| 5,603,001 A | 2/1997 | Sukegawa et al. |
| 6,085,198 A | 7/2000 | Skinner et al. |
| 6,125,399 A | 9/2000 | Hamilton |
| 6,671,694 B2 | 12/2003 | Baskins et al. |
| 7,073,115 B2 | 7/2006 | English et al. |
| 7,203,796 B1 | 4/2007 | Muppalaneni et al. |
| 7,472,249 B2 | 12/2008 | Cholleti et al. |
| 7,743,283 B1 * | 6/2010 | Taylor ................. G06F 11/0727 714/42 |
| 7,908,484 B2 | 3/2011 | Haukka et al. |
| 8,386,425 B1 | 2/2013 | Kadayam et al. |
| 8,386,433 B1 | 2/2013 | Kadayam |
| 8,799,705 B2 | 8/2014 | Hallak et al. |
| 8,977,662 B1 * | 3/2015 | Hilliar ............... G06F 17/30221 707/821 |
| 9,026,729 B1 | 5/2015 | Hallak et al. |
| 9,063,910 B1 | 6/2015 | Hallak et al. |

(Continued)

FOREIGN PATENT DOCUMENTS

JP 2014-206884 10/2014

OTHER PUBLICATIONS

U.S. Appl. No. 14/228,971, filed Mar. 28, 2014, Shoikhet et al.
(Continued)

*Primary Examiner* — Bryce P Bonzo
*Assistant Examiner* — Katherine Lin
(74) *Attorney, Agent, or Firm* — Daly, Crowley, Mofford & Durkee, LLP

(57) ABSTRACT

A hiccup management scheme for use within a storage system can maintain low latency on client I/O when a storage device is temporarily unavailable. In some embodiments, a storage using uses double parity data protection can tolerate concurrent hiccups by up to two storage devices within a storage array.

18 Claims, 8 Drawing Sheets

(56) References Cited

U.S. PATENT DOCUMENTS

| | | | |
|---|---|---|---|
| 9,104,326 | B2 | 8/2015 | Frank et al. |
| 9,703,789 | B2 | 7/2017 | Bowman et al. |
| 2003/0061227 | A1 | 3/2003 | Baskins et al. |
| 2004/0267835 | A1 | 12/2004 | Zwilling et al. |
| 2006/0271540 | A1 | 11/2006 | Williams |
| 2007/0089045 | A1 | 4/2007 | Corbett et al. |
| 2007/0240125 | A1 | 10/2007 | Degenhardt et al. |
| 2008/0082969 | A1 | 4/2008 | Agha et al. |
| 2008/0235793 | A1 | 9/2008 | Schunter et al. |
| 2009/0216953 | A1 | 8/2009 | Rossi |
| 2010/0005233 | A1 | 1/2010 | Hosokawa |
| 2010/0250611 | A1 | 9/2010 | Krishnamurthy |
| 2011/0087854 | A1 | 4/2011 | Rushworth et al. |
| 2011/0137916 | A1 | 6/2011 | Deen et al. |
| 2011/0302587 | A1 | 12/2011 | Nishikawa et al. |
| 2012/0023384 | A1 | 1/2012 | Naradasi et al. |
| 2012/0124282 | A1 | 5/2012 | Frank et al. |
| 2012/0158736 | A1 | 6/2012 | Milby |
| 2012/0204077 | A1 | 8/2012 | D'Abreu et al. |
| 2012/0233432 | A1 | 9/2012 | Feldman et al. |
| 2013/0036289 | A1 | 2/2013 | Welnicki et al. |
| 2013/0212074 | A1 | 8/2013 | Romanski et al. |
| 2013/0290285 | A1 | 10/2013 | Gopal et al. |
| 2013/0318053 | A1 | 11/2013 | Provenzano et al. |
| 2013/0326318 | A1 | 12/2013 | Haswell |
| 2013/0346716 | A1 | 12/2013 | Resch |
| 2014/0019764 | A1 | 1/2014 | Gopal et al. |
| 2014/0032992 | A1 | 1/2014 | Hara et al. |
| 2014/0122823 | A1 | 5/2014 | Gupta et al. |
| 2014/0188805 | A1 | 7/2014 | Vijayan |
| 2014/0244598 | A1 | 8/2014 | Haustein et al. |
| 2015/0019507 | A1 | 1/2015 | Aronovich |
| 2015/0098563 | A1 | 4/2015 | Gulley et al. |
| 2015/0103593 | A1* | 4/2015 | Su .................. G11C 16/3422 365/185.02 |
| 2015/0149789 | A1 | 5/2015 | Seo et al. |
| 2015/0186215 | A1 | 7/2015 | Das Sharma et al. |
| 2015/0199244 | A1 | 7/2015 | Venkatachalam et al. |
| 2015/0205663 | A1 | 7/2015 | Sundaram et al. |
| 2016/0011941 | A1 | 1/2016 | He et al. |
| 2016/0110124 | A1* | 4/2016 | Camp .................. G06F 3/0619 714/704 |
| 2016/0110252 | A1 | 4/2016 | Hyun et al. |
| 2016/0132270 | A1 | 5/2016 | Miki |
| 2017/0123995 | A1 | 5/2017 | Freyensee et al. |
| 2017/0255515 | A1* | 9/2017 | Kim .................. G06F 11/1068 |

OTHER PUBLICATIONS

U.S. Appl. No. 14/228,360, filed Mar. 28, 2014, Lempel et al.
U.S. Appl. No. 14/228,982, filed Mar. 28, 2014, Ben-Moshe et al.
U.S. Appl. No. 14/229,491, filed Mar. 28, 2014, Luz et al.
U.S. Appl. No. 14/496,359, filed Sep. 25, 2014, Love et al.
U.S. Appl. No. 14/751,652, filed Jun. 26, 2015, Natanzon et al.
U.S. Appl. No. 14/979,890, filed Dec. 28, 2015, Meiri et al.
U.S. Appl. No. 15/085,168, filed Mar. 30, 2016, Meiri et al.
U.S. Appl. No. 15/081,137, filed Mar. 25, 2016, Natanzon et al.
U.S. Appl. No. 15/079,208, filed Mar. 24, 2016, Ben-Moshe et al.
U.S. Appl. No. 15/079,213, filed Mar. 24, 2016, Ben-Moshe et al.
U.S. Appl. No. 15/079,215, filed Mar. 24, 2016, Krakov et al.
U.S. Office Action dated Aug. 27, 2015 corresponding to U.S. Appl. No. 14/228,971; 23 Pages.
Response to U.S. Office Action dated Aug. 27, 2015 corresponding to U.S. Appl. No. 14/228,971; Response filed on Jan. 14, 2016; 10 Pages.
U.S. Final Office Action dated Feb. 25, 2016 corresponding to U.S. Appl. No. 14/228,971; 27 Pages.
U.S. Office Action dated Sep. 22, 2015 corresponding to U.S. Appl. No. 14/228,982; 17 Pages.
Response to U.S. Office Action dated Sep. 22, 2015 corresponding to U.S. Appl. No. 14/228,982; Response filed on Feb. 1, 2016; 10 Pages.
U.S. Office Action dated Jan. 12, 2016 corresponding to U.S. Appl. No. 14/229,491; 12 Pages.
U.S. Office Action dated Dec. 4, 2014 corresponding to U.S. Appl. No. 14/496,262; 16 Pages.
Response to U.S. Office Action dated Dec. 4, 2014 corresponding to U.S. Appl. No. 14/496,262; Response filed on Dec. 11, 2014; 12 Pages.
U.S. Notice of Allowance dated Jan. 9, 2015 corresponding to U.S. Appl. No. 14/496,262; 8 Pages.
312 Amendment filed Feb. 5, 2015 corresponding to U.S. Appl. No. 14/496,262; 9 Pages.
U.S. Notice of Allowance dated Mar. 16, 2015 corresponding to U.S. Appl. No. 14/620,631; 10 Pages.
Response to U.S. Non-Final Office Action dated Feb. 9, 2017 for U.S. Appl. No. 14/228,971; Response filed on May 9, 2017; 12 Pages.
U.S. Non-Final Office Action dated Jun. 2, 2017 for U.S. Appl. No. 15/079,208; 19 Pages.
U.S. Appl. No. 15/282,546, filed Sep. 30, 2016, Kucherov et al.
U.S. Appl. No. 15/281,593, filed Sep. 30, 2016, Braunschvig et al.
U.S. Appl. No. 15/281,597, filed Sep. 30, 2016, Bigman.
Request for Continued Examination (RCE) and Response to U.S. Final Office Action dated Oct. 4, 2016 corresponding to U.S. Appl. No. 14/228,971; RCE and Response filed on Jan. 4, 2017; 19 Pages.
U.S. Final Office Action dated Jun. 20, 2017 for U.S. Appl. No. 14/228,971; 40 Pages.
Notice of Allowance dated Sep. 22, 2017 for U.S. Appl. No. 15/079,215; 9 Pages.
Response (w/RCE) to U.S. Final Office Action dated Jun. 20, 2017 for U.S. Appl. No. 14/228,971; Response filed Sep. 13, 2017; 14 Pages.
Notice of Allowance dated Apr. 26, 2016 corresponding to U.S. Appl. No. 14/228,982; 9 Pages.
U.S. Office Action dated Jun. 10, 2016 corresponding to U.S. Appl. No. 14/228,971; 27 Pages.
Request for Continued Examination (RCE) and Response to Final Office Action dated Feb. 25, 2016 corresponding to U.S. Appl. No. 14/228,971; Response filed on May 25, 2016; 12 Pages.
Response to Office Action dated Jan. 12, 2016 corresponding to U.S. Appl. No. 14/229,491; Response filed on Jun. 2, 2016; 7 Pages.
Notice of Allowance dated Jul. 25, 2016 corresponding to U.S. Appl. No. 14/229,491; 10 Pages.
Office Action dated Jul. 15, 2016 corresponding to U.S. Appl. No. 14/751,652; 11 Pages.
Response to U.S. Office Action dated Jun. 10, 2016 corresponding to U.S. Appl. No. 14/228,971; Response filed Aug. 17, 2016; 10 Pages.
U.S. Final Office Action dated Oct. 4, 2016 corresponding to U.S. Appl. No. 14/228,971; 37 Pages.
U.S. Non-Final Office Action dated Apr. 21, 2017 for U.S. Appl. No. 15/079,215; 53 Pages.
U.S. Non-Final Office Action dated Feb. 9, 2017 for U.S. Appl. No. 14/228,971; 38 Pages.
Response to U.S. Non-Final Office Action dated Apr. 21, 2017 for U.S. Appl. No. 15/079,215; Response filed on Jul. 21, 2017; 9 Pages.
Response to Office Action dated Jun. 2, 2017 from U.S. Appl. No. 15/079,208, filed Sep. 5, 2017; 10 Pages.
EMC Corporation, "Introduction to the EMC XtremIO Storage Array;" Version 4.0; White Paper—A Detailed Review; Apr. 2015; 65 Pages.
Vijay Swami, "XtremIO Hardware/Software Overview & Architecture Deepdive;" EMC On-Line Blog; Nov. 13, 2013; Retrieved from <http://vjswami.com/2013/11/13/xtremio-hardwaresoftware-overview-architecture-deepdive/>; 18 Pages.
U.S. Non-Final Office Action dated Oct. 4, 2017 for U.S. Appl. No. 14/228,971; 37 pages.
U.S. Non-Final Office Action dated Nov. 13, 2017 for U.S. Appl. No. 15/079,213; 9 pages.
Response to U.S. Non-Final Office Action dated Oct. 4, 2017 corresponding to U.S. Appl. No. 14/228,971; Response filed Jan. 26, 2018; 11 Pages.

(56) References Cited

OTHER PUBLICATIONS

U.S. Final Office Action dated May 29, 2018 for U.S. Appl. No. 14/228,971; 35 pages.
U.S. Non-Final Office Action dated May 31, 2018 for U.S. Appl. No. 15/281,593; 10 pages.
Response to U.S. Non-Final Office Action dated Dec. 1, 2017 for U.S. Appl. No. 14/979,890; Response filed on Feb. 28, 2018; 9 Pages.
Response to U.S. Non-Final Office Action dated Nov. 13, 2017 for U.S. Appl. No. 15/079,213; Response filed on Feb. 13, 2018; 9 Pages.
U.S. Non-Final Office Action dated Dec. 29, 2017 corresponding to U.S. Appl. No. 15/079,208; 10 Pages.
U.S. Non-Final Office Action dated Dec. 22, 2017 corresponding to U.S. Appl. No. 15/282,546; 12 Pages.
Response to U.S. Non-Final Office Action dated Dec. 29, 2017 for U.S. Appl. No. 15/079,208; Response filed on Apr. 30, 2018; 7 Pages.
Response to U.S. Non-Final Office Action dated Dec. 22, 2017 for U.S. Appl. No. 15/282,546; Response filed May 17, 2018; 8 Pages.
U.S. Non-Final Office Action dated Dec. 1, 2017 for U.S. Appl. No. 14/979,890; 10 Pages.
U.S. Notice of Allowance dated Jul. 12, 2018 for U.S. Appl. No. 15/079,213; 6 Pages.

* cited by examiner

HICCUP MANAGEMENT IN A STORAGE ARRAY

BACKGROUND

Solid-state drives (SSDs, also known as a solid-state disks) are a class of storage devices that may use integrated circuit assemblies as memory to store data persistently. SSDs may have better read/write performance compared to hard disk drives (HDDs). SSDs may be used in storage arrays to provide high performance scale-out storage.

SSDs can experience "hiccups" (or "stutters") which adversely affect read and/or write operations. Hiccups may occur due to internal SSD processing, such as garbage collection. In general, it is difficult (if not impossible or at least impractical) to predict when hiccups will occur. Hiccups can increase the latency of read and write operations, adversely affecting system performance.

As is also known in the art, RAID (Redundant Array of Inexpensive/Independent Disks) is a concept designed to provide increased resiliency and reliability to storage arrays. It allows reconstruction of failed disks (and parts of disks) through the use of redundancy. RAID 6 defines block-level striping with double distributed parity (N+2) and provides fault tolerance of two drive failures, so that a storage array can continue to operate with up to two failed drives, irrespective of which two drives fail. To provide efficient reads, data is stored "in the clear," whereas parity information can be based on a suitable coding scheme.

SUMMARY

Described herein are embodiments of a hiccup management scheme that can allow a storage system to maintain low latencies on client I/O when a storage device is temporarily unavailable. If the storage system uses RAID 6-like data protection, the disclosed hiccup management scheme may allow the storage system to tolerate concurrent hiccups by up to two storage devices in an array. Also described herein is a storage system that may utilize hiccup management to improve performance in accordance with embodiments of the disclosure.

According to an aspect of the disclosure, a method comprises: receiving an I/O operation; performing the I/O operation against a first storage device within a storage array; detecting a timeout in response to performing the I/O operation against the first storage device; marking the first storage device as temporarily unavailable; performing a plurality of I/O operations against the first storage device; and marking the first storage device as faulty or available based upon results of the plurality of I/O operations. In various embodiments, the storage array comprises a plurality of solid state drives (SSDs).

In some embodiments, the method further comprises, in response to marking the first storage device faulty, recovering data stored on the first storage device using other data and parity information stored on at least second and third storage devices within the storage array and writing the recovered data to at least one storage device within the storage array different from the first storage device. In one embodiment, performing a plurality of I/O operations against the first storage device comprises performing periodic I/O operations against the first storage device. In some embodiments, marking the first storage device as faulty or available based upon results of the plurality of I/O operations comprises marking the first storage device as faulty if each of the plurality of I/O operations performed against the first storage device fails; and marking the first storage device as available if at least one of the plurality of I/O operations performed against the first storage device succeeds. In certain embodiments, the method further comprises, in response to marking the first storage device as faulty, commencing a rebuild process to recover data stored on the first storage device.

According to another aspect of the disclosure, a method comprises: receiving a first I/O operation; determining that the first I/O operation is associated with first data stored on a first storage device within a storage array; determining that the first storage device is temporarily unavailable; and performing a degraded I/O operation against at least second and third storage devices within the storage array to recover the first data.

In some embodiments, the method further comprises receiving a second I/O operation; determining to perform the second I/O operation against a second storage device within the storage array in response to determining that the first storage device is temporarily unavailable; and performing the second I/O operation against to the second storage device. In certain embodiments, the method further comprises: performing a plurality of I/O operations against the first storage device and marking the first storage device as faulty or available based upon results of the plurality of I/O operations performed against the first storage device. In one embodiment, marking the first storage device as faulty or available based upon results of the plurality of I/O operations performed against the first storage device comprises marking the first storage device as faulty if each of the plurality of I/O operations performed against the first storage device fail and marking the first storage device as available if at least one of the plurality of I/O operations performed against the first storage device succeed. In certain embodiments, the method further comprises, in response to marking the first storage device as faulty, commencing a rebuild process to recover data stored on the first storage device. In various embodiments, the storage array comprises a plurality of solid state drives (SSDs).

According to another aspect of the disclosure, a system comprises: a processor and a memory storing computer program code that when executed on the processor causes the processor to execute a process operable to perform one or more embodiments of the methods described hereinabove.

BRIEF DESCRIPTION OF THE DRAWINGS

The foregoing features may be more fully understood from the following description of the drawings in which.

The drawings are not necessarily to scale, or inclusive of all elements of a system, emphasis instead generally being placed upon illustrating the concepts, structures, and techniques sought to be protected herein.

DETAILED DESCRIPTION

Before describing embodiments of the structures and techniques sought to be protected herein, some terms are explained. As used herein, the term "storage system" may be broadly construed so as to encompass, for example, private or public cloud computing systems for storing data as well as systems for storing data comprising virtual infrastructure and those not comprising virtual infrastructure. As used herein, the terms "client" and "user" may refer to any person, system, or other entity that uses a storage system to read/write data.

As used herein, the term "storage device" may refer to any non-volatile memory (NVM) device, including hard disk drives (HDDs), flash devices (e.g., NAND flash devices), and next generation NVM devices, any of which can be accessed locally and/or remotely (e.g., via a storage attached network (SAN)). The term "storage array" may be used herein to refer to any collection of storage devices. In some embodiments, a storage array may provide data protection using RAID 4, RAID 5, RAID 6, or the like.

As used herein, the term "random access storage device" may refer to any non-volatile random access memory (i.e., non-volatile memory wherein data can be read or written in generally the same amount of time irrespective of the physical location of data inside the memory). Non-limiting examples of random access storage devices may include NAND-based flash memory, single level cell (SLC) flash, multilevel cell (MLC) flash, and next generation non-volatile memory (NVM). For convenience of explanation, the term "solid-state disk" (SSD) may be used interchangeably with "random access storage device." However, it should be understood that the disclosure is not limited to any particular random access non-volatile memory technology.

While vendor-specific terminology may be used herein to facilitate understanding, it is understood that the concepts, techniques, and structures sought to be protected herein are not limited to use with any specific commercial products.

Figure 1:
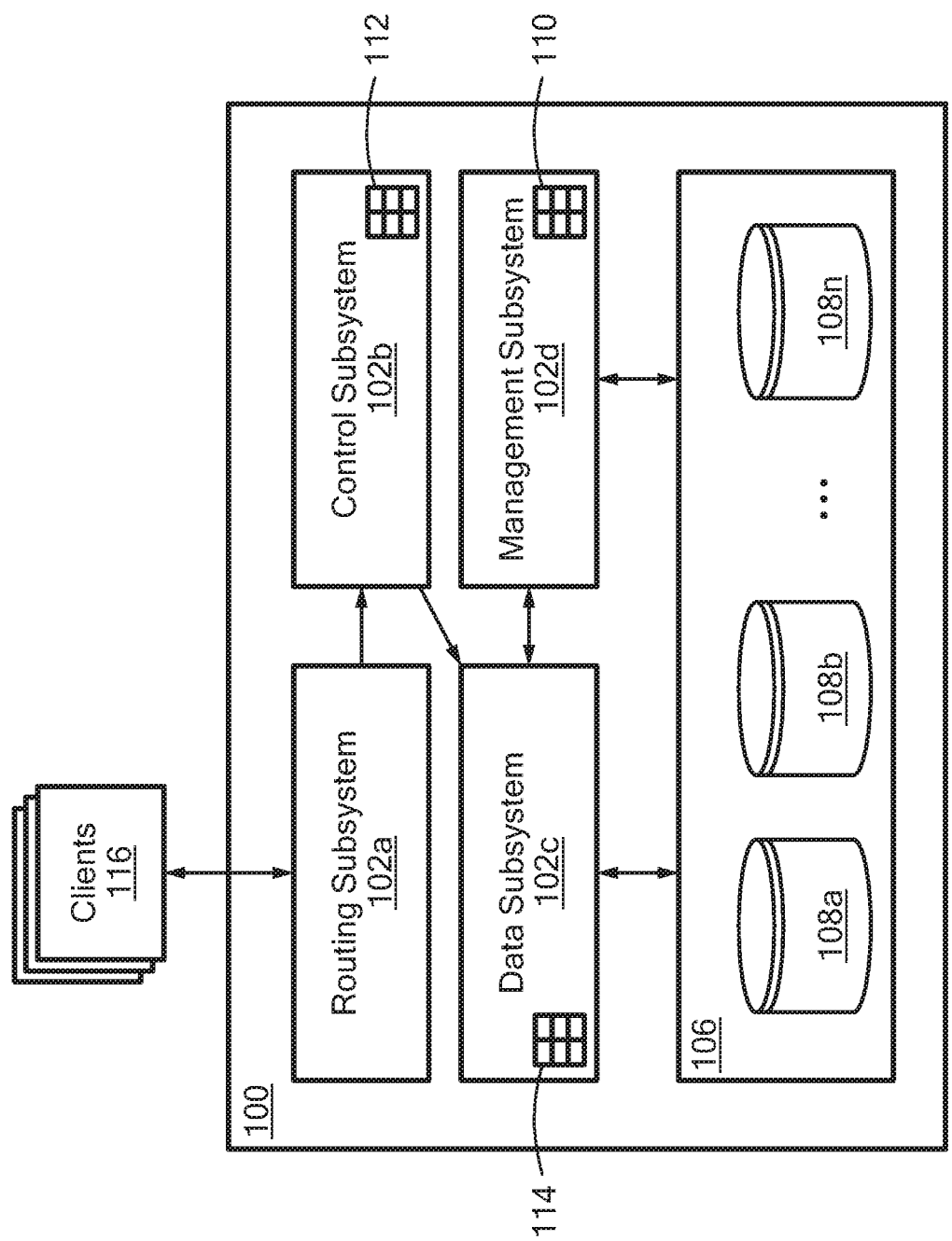
FIG. 1 is a block diagram of a storage system in accordance with an embodiment of the disclosure.

FIG. 1 shows a storage system 100 according to an illustrative embodiment of the disclosure. The illustrative storage system 100 may include a plurality of subsystems 102a-102d (generally denoted 102 herein), and a storage array 106 comprising a plurality of SSDs 108a . . . 108n (generally denoted 108 herein).

In the embodiment shown, the subsystems 102 include a routing subsystem 102a, a control subsystem 102b, a data subsystem 102c, and a management subsystem 102d. In one embodiment, the components 102 may be provided as software components, i.e., computer program code that, when executed on a processor, may cause a computer to perform functionality described herein. In a certain embodiment, the storage system 100 includes an operating system (OS) and one or more of the subsystems 102 may be provided as user space processes executable by the OS. In other embodiments, the subsystems 102 may be provided, at least in part, as hardware such as digital signal processor (DSP) or an application specific integrated circuit (ASIC) configured to perform functionality described herein.

The routing subsystem 102a may be configured to receive read and write requests from clients 116 using, for example, an external application programming interface (API) and to translate client requests into internal commands. In some embodiments, the routing subsystem 102a is configured to receive Small Computer System Interface (SCSI) commands from clients 116. In certain embodiments, the system 100 may store data in fixed-size chunks (or "blocks"), for example 4K chunks, where each chunk may have a unique hash value (referred to herein as a "chunk hash"). In such embodiments, the routing subsystem 102a may be configured to split data into fixed-size chunks and to calculate the corresponding chunk hashes. In one embodiment, chunk hashes are calculated using Secure Hash Algorithm 1 (SHA-1) processing. In some embodiments, a chunk corresponds to a fixed number of contiguous blocks within a storage device.

The control subsystem 102b may be configured to maintain a mapping between I/O addresses associated with data and the corresponding chunk hashes. As shown in FIG. 1, this mapping may be maintained using a data structure 112, referred to herein as an "I/O address to chunk hash mapping table" or "A2H table," according to some embodiments. In a preferred embodiment, I/O addresses may be logical addresses used by clients to access data within the storage system 100.

The data subsystem 102c may be configured to maintain a mapping between chunk hashes and physical storage addresses (i.e., storage locations within the storage array 106 and/or within individual SSDs 108). As shown in FIG. 1, this mapping may be maintained as a data structure 114, referred to herein as a "hash to physical address mapping table" or "H2P table," according to some embodiments. The data subsystem 102c may be also be configured to read and write data from/to the storage array 106 (and/or to individual SSDs 108 therein). In some embodiments, the data subsystem 102c may access the storage array 106 via a driver or other type of interconnect.

It will be appreciated that combinations of the A2H 112 and H2P 114 tables may provide multiple levels of indirection between the logical (or "I/O") address a client 116 uses to access data and the physical address where that data is stored. Among other advantages, this can give the storage system 100 freedom to move data within the storage array 106 without affecting a client's 116 access to that data (e.g., if an SSD 108 fails).

Figure 2:
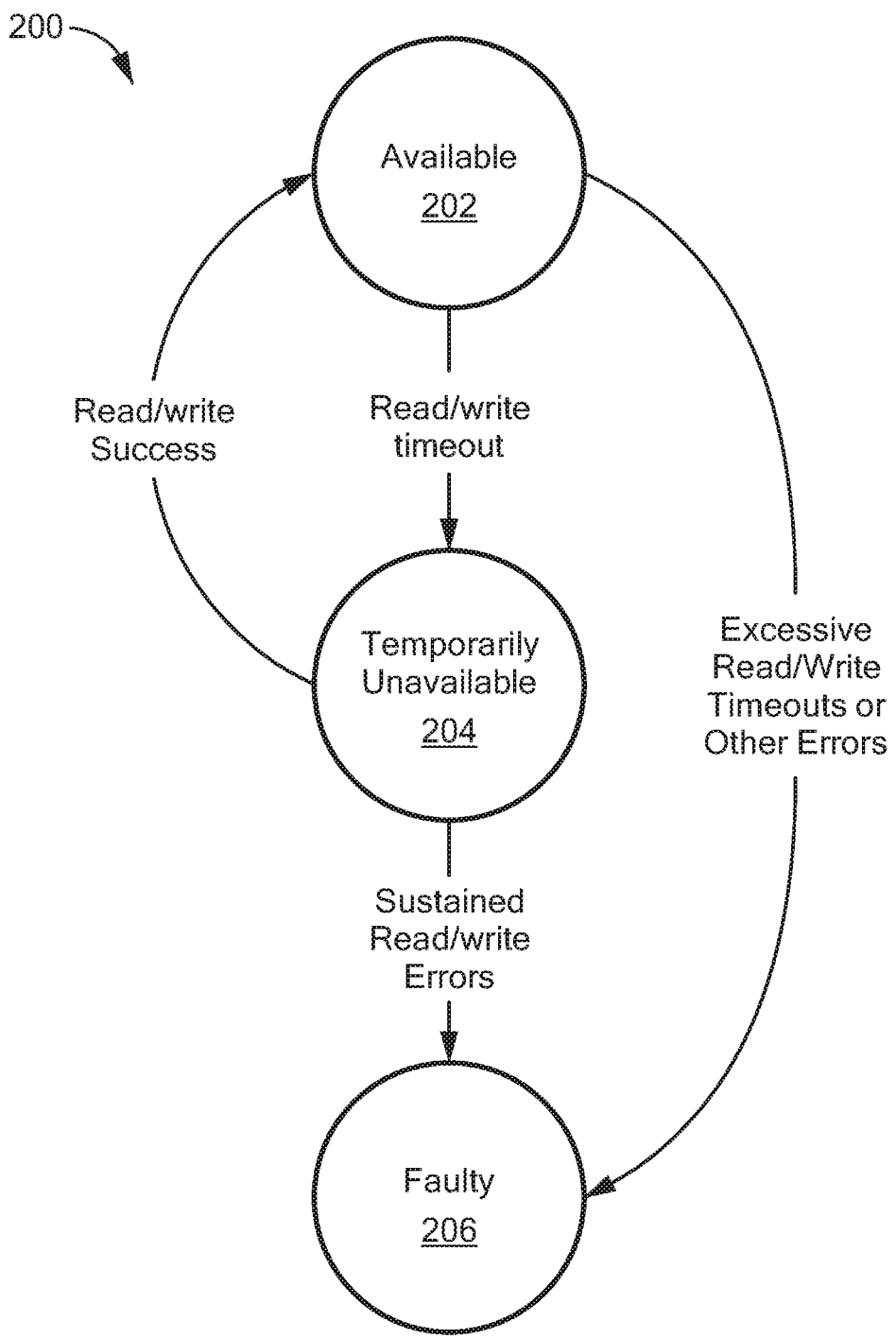
FIG. 2 is a state diagram illustrating various states that may be associated with a solid-state drive (SSD) in accordance with an embodiment of the disclosure.

The management subsystem 102d may be configured to monitor and track the status of various hardware and software resources within the storage system 100. In some embodiments, the management subsystem 102d may be configured to maintain information about the health of the SSDs 108. In the embodiment shown, the management subsystem 102d is configured to maintain an SSD state table 110, in which each SSD 108 can be associated with a particular state. FIG. 2 shows examples of different states that can be associated with a given SSD 108, according to an embodiment.

In various embodiments, the storage system 100 may provide data protection through redundancy such that if an SSD 108 fails, the data stored therein may be recovered from other SSDs within the storage array 106 to a replacement SSD. In certain embodiments, the storage system may be configured to provide double parity data protection. Thus, the storage system 100 may be able to tolerate the loss of at least two SSDs 108 concurrently. In one embodiment, data subsystem 102c may implement a data protection scheme similar to RAID 6 but adapted to take advantage of random access storage. In some embodiments, block-level striping and distributed parity may be used. In various embodiments, the storage system 100 may use uses double parity data protection techniques described within U.S. Pat. No. 8,799,705, issued on Aug. 5, 2014, which is hereby incorporated by reference in its entirety. The data subsystem 102c—or a "RAID module" therein—may be configured to provide data protection, according to some embodiments.

In some embodiments, the storage system 100 includes features used in EMC® XTREMIO®.

FIG. 2 is a state diagram showing various states 202, 204, 206 that may be associated with an SSD 108 (FIG. 1), according to embodiments of the disclosure. In various embodiments, states shown in FIG. 2 may be used within an SSD state table 110 (FIG. 1). In some embodiments, one or more of the states 202-206 may be used within the methods shown in FIGS. 4A and 4B and described below in conjunction therewith.

Initially, the SSD may be associated with an available state 202. If a timeout occurs when reading/writing data from/to the SSD, the SSD may be transitioned to a temporarily unavailable state 204. According to some embodiments, if an excessive number of read/write timeouts or other errors occurs within a pre-determined time interval, the SSD can be transitioned directly from the available state 202 to a faulty state 206, as shown. Examples of "other errors" may include read/write errors or Serial Attached SCSI (SaS) link errors.

Once the SSD is in the temporarily unavailable state 204, periodic health checks may be performed against the SSD to determine if the timeout was transient (e.g., the result of a hiccup), or if the SSD is faulty and should be removed from service. If it is determined that the timeout was the result of a hiccup, the SSD may be transitioned back to the available state 202. Otherwise the SSD may be transitioned to the faulty state 206. In some embodiments, multiple read/write requests are made against the SSD within a pre-determined time interval. If the number of timeouts or other errors exceeds a pre-determined threshold, the SSD may be deemed faulty 206. If the number of timeouts/errors is less than a pre-determined threshold, the SSD may be transitioned back to the available state 202. In one embodiment, if any of the read/writes succeed, the SSD is associated back to the available state 202; otherwise the SSD is determined to be faulty 206.

FIGS. 3A-3E illustrate processing that may occur within a storage system, according to some embodiments of the disclosure. In certain embodiments, the processing may be implemented within the storage system 100 of FIG. 1 and may be used to reduce (and ideally minimize) the effects of SSD hiccups on client I/O latency. Within the several FIGS. 3A-3E, like elements are shown having like reference designations.

Figure 3A:
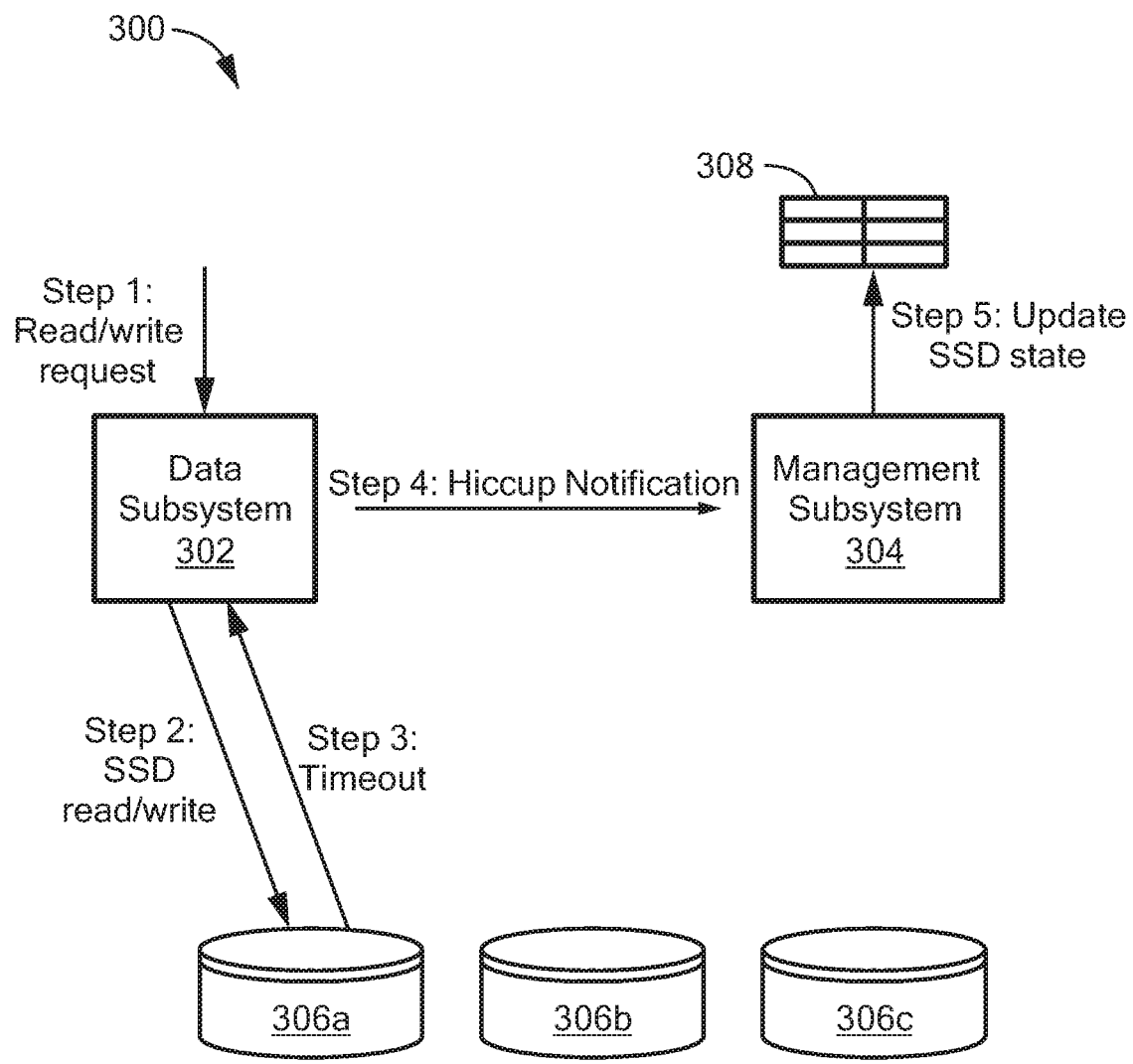
FIGS. 3A-3E are system diagrams illustrating flow control that may occur within a storage system in accordance with some embodiments of the disclosure.

FIG. 3A illustrates detecting and handling an SSD hiccup, according to an embodiment of the disclosure. As shown, a storage system 300 may include a data subsystem 302, a management subsystem 304, and a storage array having a plurality of SSDs 306a-306c (generally denoted 306). The illustrated embodiments may include an array of three SSDs 306a-306c, although it should be understood that larger storage arrays can be used. In some embodiments, the minimum number of SSDs 306 may be determined by the data-protection scheme (e.g., the RAID level) in use. In the embodiment shown, the management subsystem 304 is configured to maintain an SSD state table 308 which can indicate a state for each of the SSDs 306.

As illustrated in FIG. 3A, as an initial condition, it is assumed that each of the SSDs 306a-306b is in the available state 202 (FIG. 2). The data subsystem 302 receives a request to read or write data ("Step 1"). In some embodiments, the request is received from a client (e.g., by way of a routing subsystem 102a and control subsystem 102b (FIG. 1)). As illustrated in FIG. 3A, the data subsystem 302 may determine which SSD 306 to read/write the data from/to. In this example, the data subsystem 302 determines to read/write from/to the first SSD 306a. In some embodiments, the data subsystem 302 may use an H2P table 114 (FIG. 1) to make this determination. In this example, the data subsystem 302 issues a read/write to the first SSD 306a ("Step 2").

If the first SSD 306a is performing internal processing (e.g., garbage collection) at the time of the read/write, the read/write may timeout ("Step 3"). The timeout can be detected by the data subsystem 302, according to some embodiments. In turn, the data subsystem 302 can notify the management subsystem 304 of the SSD 306a timeout (i.e., hiccup) ("Step 4"). The management subsystem 304 can use this information to decide which state the SSD 306a should be transitioned to (if any). In particular, in some embodiments, the management subsystem 304 can decide to transition the SSD 306a to the temporarily unavailable state 204 (FIG. 2), to the faulty state 206, or to not leave the SSD 306 in the available state 202. The management subsystem 304 can update the SSD state table 308 to indicate the new state for the SSD 306a ("Step 5"). In some embodiments, the management subsystem 304 may signal the new SSD state to the data subsystem 302. In other embodiments, the data subsystem 302 can determine SSD states by directly accessing the SSD state table 308.

In some embodiments, the management subsystem 304 may use an optimistic strategy whereby the management subsystem 304 assumes that an available SSD 306 which times out is merely experiencing a hiccup. Thus, management subsystem 304 may transition the SSD 306a from the available state 202 to the temporarily unavailable state 204 (FIG. 2). According to certain embodiments, the management subsystem 304 uses historical information to determine which state an available SSD should be transitioned to (if any). For example, the management subsystem 304 can track the number of timeouts (or other SSD errors) that occur within a pre-determined time interval and use this information to transition the SSD 306a to the temporarily unavailable state 204 (FIG. 2) or directly to the faulty state 206. Such historical information may be stored within the SSD state table 308 or in any other suitable data structure.

Figure 3B:
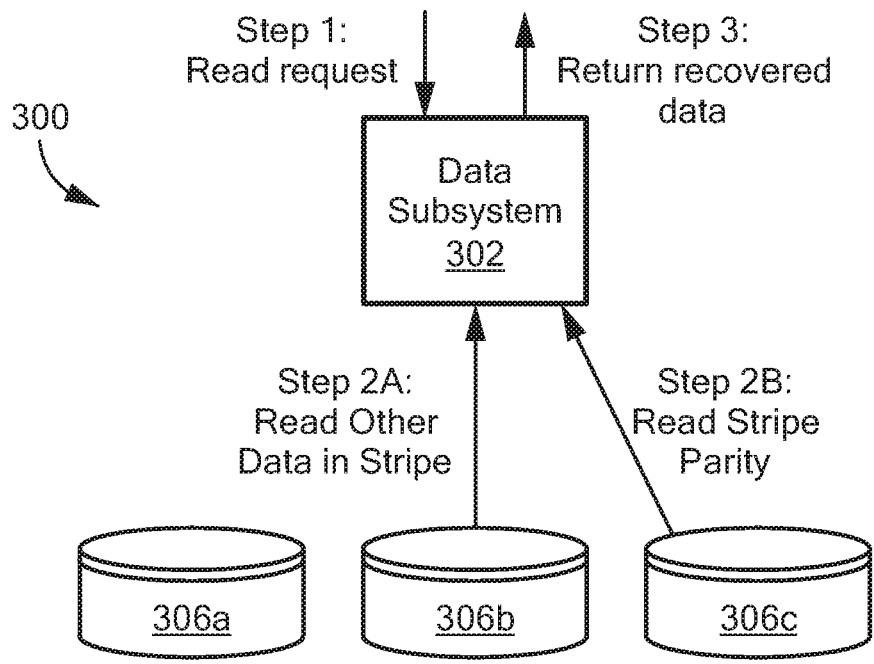

FIG. 3B illustrates reading data during an SSD hiccup period, according to embodiments of the disclosure. In the illustrated embodiment, a storage system 300 protects data using block-level striping and distributed parity, as described above in conjunction with FIG. 1. In this example, it is assumed that some data to be read is stored within a first SSD 306a, that other data within the same stripe is stored within a second SSD 306b, and that parity information for the stripe is stored within a third SSD 306c.

As illustrated in FIG. 3B, a data subsystem 302 receives a request to read data ("Step 1"). In this example, the data subsystem 302 may determine that the requested data is stored within the first SSD 306a. In some embodiments, the data subsystem 302 uses an H2P table 114 (FIG. 1) to make this determination. The data subsystem 302 may further determine that the first SSD 306a is in the temporarily unavailable state 204 (FIG. 2). The data subsystem 302 can determine the SSD 306a state via the management subsystem 304 (FIG. 3A) or by directly accessing the SSD state table 308 (FIG. 3A), according to some embodiments.

Rather than waiting for the SSD 306a to become available (e.g. waiting for a hiccup period to cease), the data subsystem 302 may instead perform a degraded read using available SSDs. In the example shown, the data subsystem 302 performs a degraded read using information stored in the second and third SSDs 306b, 306c. In particular, the data subsystem 302 can read other data within the same stripe as the requested data from the second SSD 306b ("Step 2A") and can read stripe parity information from the third SSD 306c ("Step 2B"). In some embodiments, these two reads may be performed in parallel to reduce I/O latency. The data subsystem 302 can then recover the requested data using the information read from available SSDs 306b, 305c and return the recovered data to the client ("Step 3"). Any suitable parity-based data recovery technique can be used.

Figure 3C:
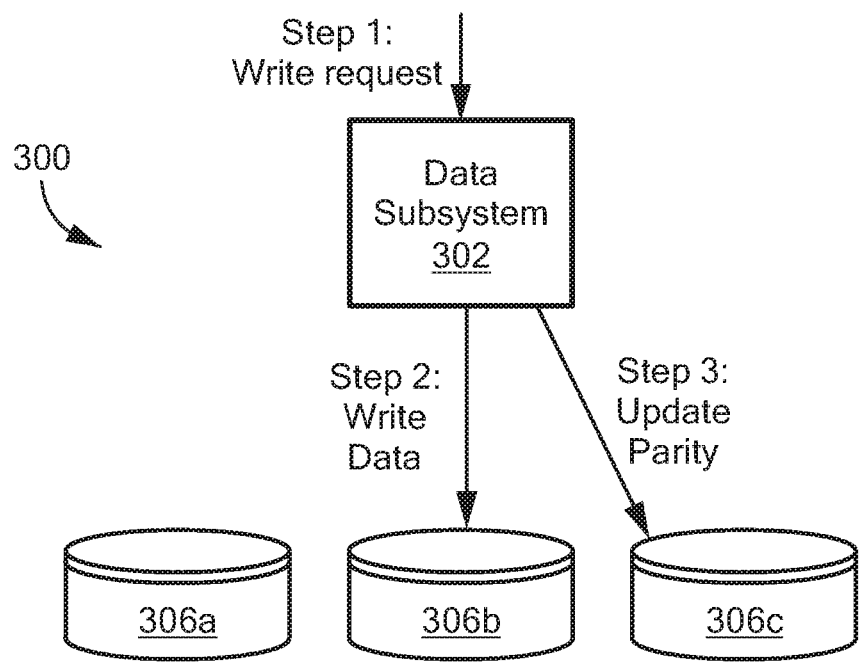

FIG. 3C illustrates writing data during an SSD hiccup period, according to embodiments of the disclosure. As illustrated in FIG. 3C, a storage system 300 includes an array of SSDs 306a-306c, where a first SSD 306a is assumed to be in the temporarily unavailable state 204 (FIG. 2).

A data subsystem 302 receives a request to write data ("Step 1"). The data subsystem 302 may determine that a first SSD 306a is temporarily unavailable. The data subsystem 302 can determine the SSD 306a state via the management subsystem 304 (FIG. 3A) or by directly accessing the SSD state table 308 (FIG. 3A), according to some embodiments. The data subsystem 302 can then make a decision to write the data to any available SSD (e.g., to either of SSDs 306b, 306c). In this example, the data subsystem 302 writes the data to a second SSD 306b ("Step 2"). In certain embodiments, the storage system 300 may be configured to provide double parity data protection. Thus, the data subsystem 302 may also update parity information stored on yet another SSD ("Step 3"), according to some embodiments. In the example shown, the data subsystem 302 writes parity information to a third SSD 306c. Any known technique can be used to update parity information. The data subsystem may then update the H2P table 114 (FIG. 1) to indicate the physical address where the data, indexed by a hash of the data.

Figure 3D:
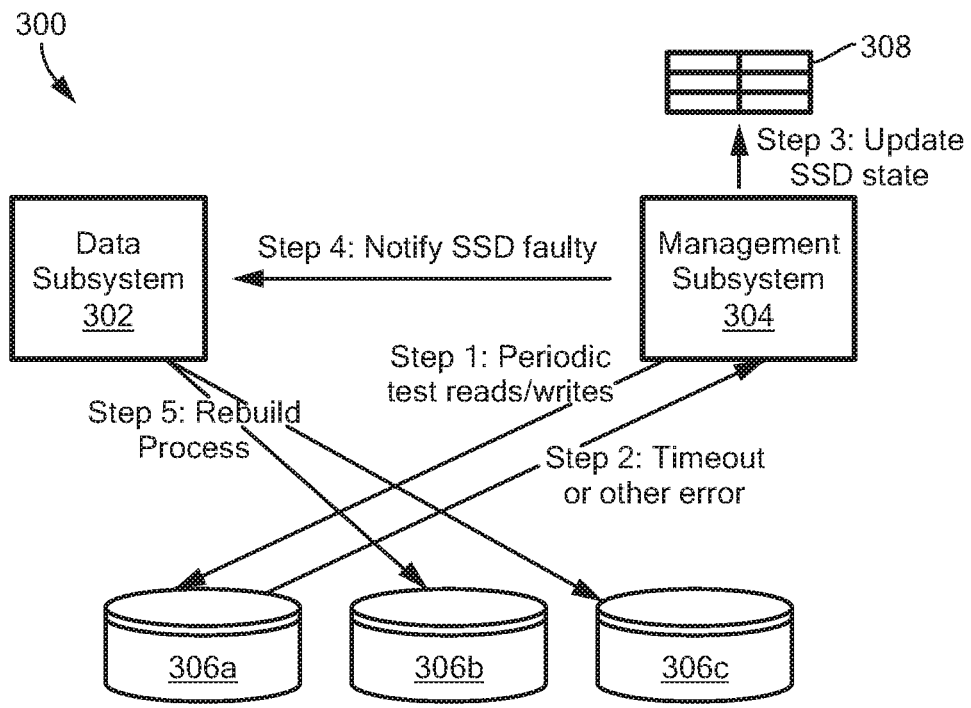

FIG. 3D illustrates performing periodic health checks against an SSD, according to embodiments of the disclosure. In various embodiments, after an SSD experiences a read/write timeout (e.g., after it transitions to the temporarily unavailable state 204 of FIG. 2), the management subsystem 304 may perform a periodic health check on the SSD to determine if a hiccup period has ended or if the SSD is faulty. In some embodiments, periodic health checks can be performed "in the background," meaning that the health checks do not have any significant impact on normal I/O request processing within the system 300.

In the embodiment shown, the management subsystem 304 performs periodic health checks by issuing reads, writes, or a combination of reads and writes to an SSD 306. In some embodiments, the type of health check operations used by the management subsystem 304 may be determined based upon the original SSD timeout. For example, if the original SSD timeout occurred when reading from a particular location (e.g., offset or page), the management subsystem 304 may periodically attempt to read from that same offset, according to some embodiments. As another example, in some embodiments, if the original SSD timeout occurred when writing, the management subsystem 304 may periodically attempt to write to a reserved page within the SSD; this strategy prevents unintentionally overwriting data.

In the example of FIG. 3D, it is assumed that the management subsystem 304 is monitoring the first SSD 306a. The management subsystem 304 may issue periodic reads and/or writes to the SSD 306a ("Step 1"). In some embodiments, the management subsystem 304 may keep track of how many of the read/write operations succeed and how many fail ("Step 2"). Failures can include timeouts or other errors reported by the SSD 306a or detected by the management subsystem 304. The management subsystem 304 can use the success/failure statistics to make a decision about the health of the SSD 306a, according to some embodiments. In particular, the management subsystem 304 can determine that the SSD 306a is faulty 206 and should be transitioned to the faulty state 206 (FIG. 2), whether the SSD 306a is operational and should be transitioned back to the available state 202, or whether the SSD 306a may still be experience a hiccup period and should remain in the temporarily unavailable state 204. Criteria that may be used to determine SSD health are described above in conjunction with FIG. 2, according to various embodiments.

In this example, the management subsystem 304 detects timeouts or other errors from the SSD 306a ("Step 2") and uses this information to determine that the SSD 306a is faulty. As shown, in some embodiments the management subsystem 304 can update the SSD state table 308 ("Step 3") to associate the SSD 306 with a new state (e.g., faulty state 206 in this example). In some embodiments, the management subsystem 304 may also notify the data subsystem 302 that the SSD 306a is faulty and should be removed from service ("Step 4"). In response, the data subsystem 302 can begin a rebuild process to recover the data stored on faulty SSD 306a ("Step 5"), according to some embodiments. Any suitable rebuild processing can be used, such as existing RAID rebuild processes. In the example shown, the rebuild process recovers data that was stored on SSD 306a by reading other data and parity information from the available SSDs 306b, 306c. The recovered data can then be stored in any available SSDs 306 (other than SSD 306a removed from service) and the H2P table 114 (FIG. 1) can be updated to indicate the new physical storage addresses for the recovered data.

Figure 3E:
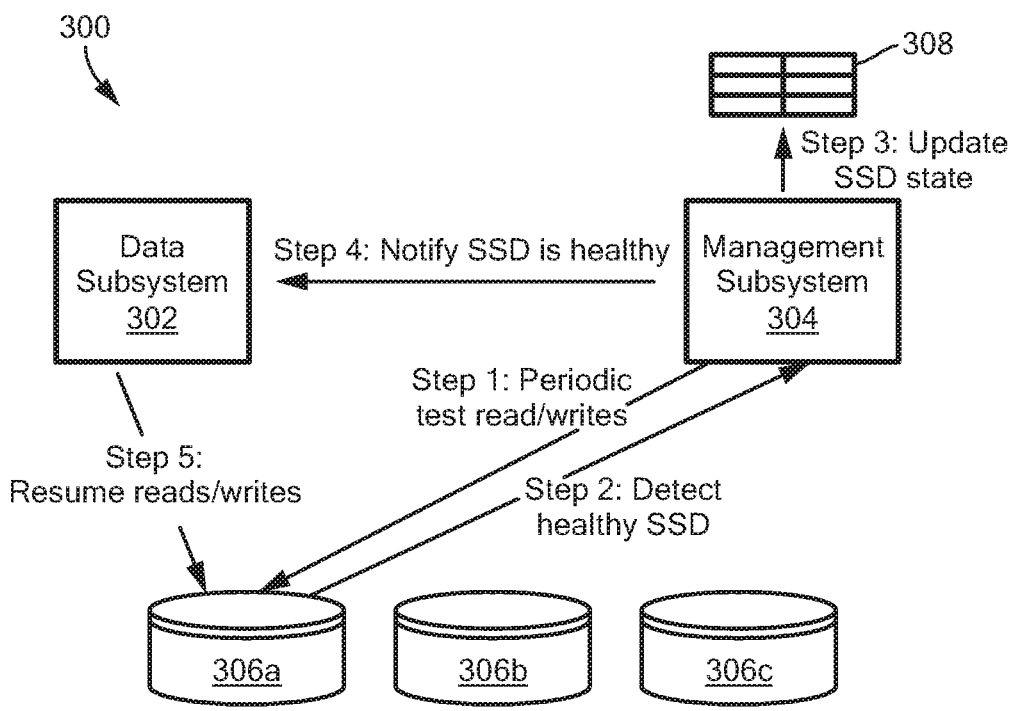

FIG. 3E shows another example of performing periodic health checks against an SSD 306, according to embodiments of the disclosure. In this example, it is assumed that the SSD 306a being checked experienced a hiccup (i.e., it is not faulty). The management subsystem 304 may send periodic reads and/or writes to the SSD 306a ("Step 1") and determine that the hiccup period has ended ("Step 2"). In the embodiment shown, the management subsystem 304 updates the SSD state table 308 ("Step 4") to associate the SSD 306a with the available state 202 (FIG. 2). The management subsystem 304 may notify the data subsystem 302 to resume using the SSD 306a ("Step 4"). In response, the data subsystem 302 can resume reading data from and writing data to the SSD 306a ("Step 5"), according to some embodiments.

In addition to performing periodic health checks against an SSD 306 that experienced a timeout, the management subsystem 304 can, in some embodiments, monitor the health of all SSDs 306 to proactively detect SSD hiccups or faults. In certain embodiments, the management subsystem 304 may monitor SSD read/write completion times and use this information to detect hiccups or faults. In one embodiment, the management subsystem 304 may transition SSDs 306 to the temporarily unavailable state 204 if I/O times for that SSD 306 exceed a pre-defined threshold.

It will be appreciated that the hiccup management scheme illustrated in FIGS. 3A-3E and described above in conjunction therewith can allow a storage system 300 to maintain low latencies on client I/O even when an SSD is temporarily unavailable. In some embodiments, a storage system 300 uses double parity data protection and can tolerate hiccups by up to two SSDs concurrently.

Figure 4A:
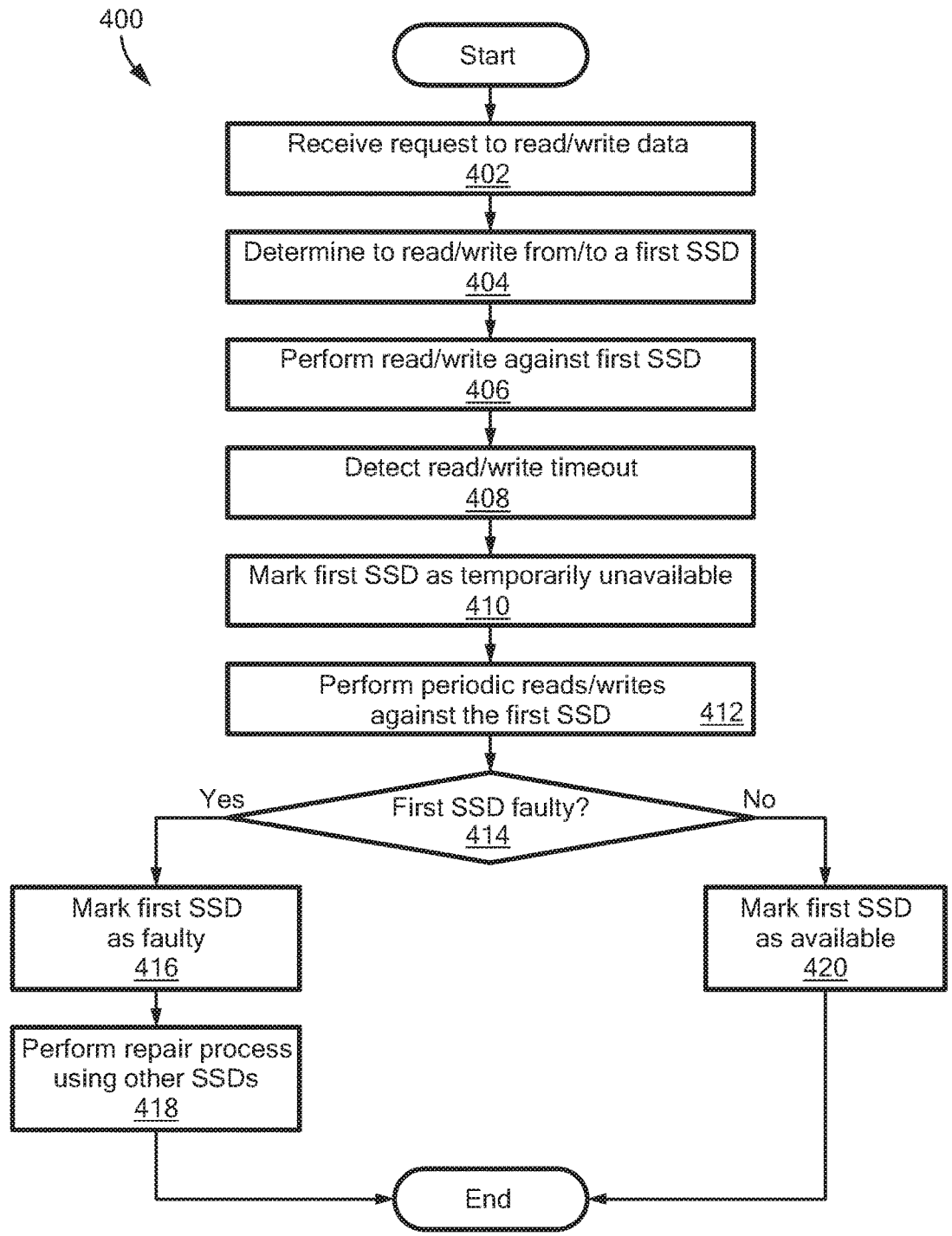
FIGS. 4A and 4B are flow diagrams illustrating processing that may occur within a storage system in accordance with some embodiments of the disclosure.
Figure 4B:
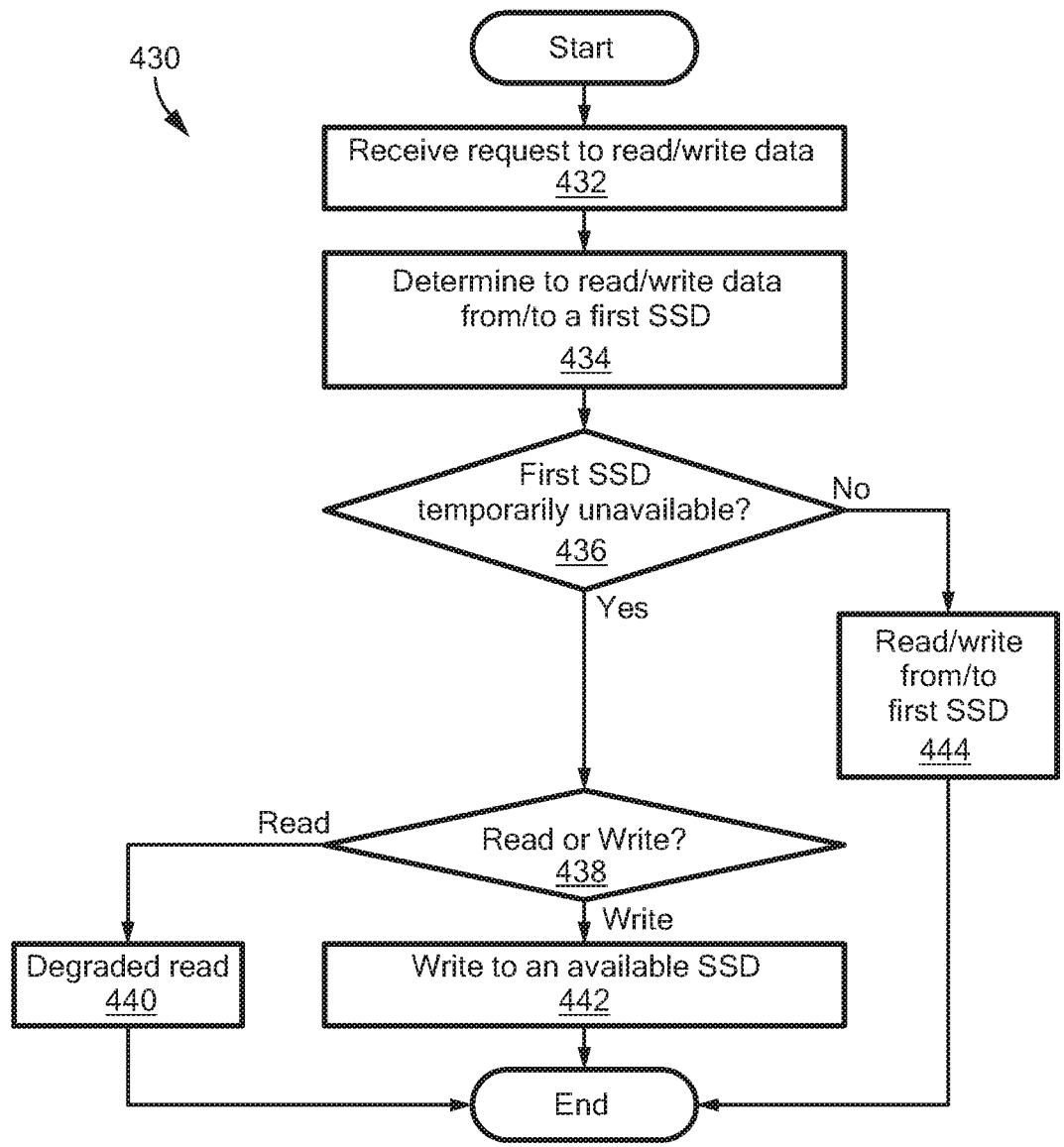

FIGS. 4A and 4B are flow diagrams showing illustrative processing that can be implemented within a storage system (e.g., storage system 100 of FIG. 1), according to some embodiments. Rectangular elements (typified by element 402 in FIG. 4A), herein denoted "processing blocks," represent computer software instructions or groups of instructions. Diamond shaped elements (typified by element 414 in FIG. 4A), herein denoted "decision blocks," represent computer software instructions, or groups of instructions, which affect the execution of the computer software instructions represented by the processing blocks.

Alternatively, the processing and decision blocks may represent steps performed by is functionally equivalent circuits such as a digital signal processor (DSP) circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the concepts, structures, and techniques sought to be protected herein. Thus, unless otherwise stated the blocks described below are unordered meaning that, when possible, the functions represented by the blocks can be performed in any convenient or desirable order.

Referring to FIG. 4A, a method 400 can be used to detect SSD hiccups and faults, according to some embodiments of the disclosure. At block 402, a request is received to read or write data. At block 404, a determination may be made to read/write the data from/to a first SSD within a storage array. In some embodiments, this determination is based on a content-address addressing scheme, for example, an A2H table 112 and/or an H2P table 114 (FIG. 1). At block 406, a read/write may be performed against the first SSD and, at block 408, a read/write timeout is detected. In response to detecting the read/write timeout, at block 410, the first SSD may be marked as temporarily unavailable.

After a timeout is detected, the method 400 can determine if the first SSD is merely experiencing a hiccup or if it is faulty. At block 412, periodic reads and/or writes may be performed against the first SSD. At block 414, the results of the periodic reads/writes can be used to determine if the first SSD is faulty. In some embodiments, the number of timeouts or other errors resulting from the periodic reads/writes may be used to determine if the first SSD is faulty, as previously explained. If the first SSD is determined to be faulty, it can be marked as such (block 416) and a RAID repair process can commence to recover data stored on the first SSD using other SSDs in the storage array (block 418). If the SSD is determined to not be faulty, it can be marked as available (block 420).

Referring to FIG. 4B, a method 430 can be used to mitigate the effect of SSD hiccups on client I/O operations, according to some embodiments. At block 432, a request is received to read or write data. At block 434, a determination may be made to read/write the data from/to a first SSD within a storage array. In some embodiments, this determination is based on a content-address addressing scheme using, for example, an A2H table 112 and/or an H2P table 114 (FIG. 1). At block 436, a determination may be made that the first SSD is temporarily unavailable. In some embodiments, this determination may be based on information within an SSD state table 110 (FIG. 1).

If the first SSD is temporarily unavailable, then other SSDs within the storage array can be used to process the read/write request. In particular, for read requests (block 438), a degraded read may be performed (block 440). In some embodiments this may include reading other data within the same stripe from a second SSD within the storage array, and reading parity information from a third SSD within the storage array. The requested data may then be recovered using known techniques. In the case of a write request (block 438), the data can be written to any available SSD in the storage array (block 442). If the first SSD is determined to be available (block 436), then the data can be read/written therefrom/thereto (block 444).

Figure 5:
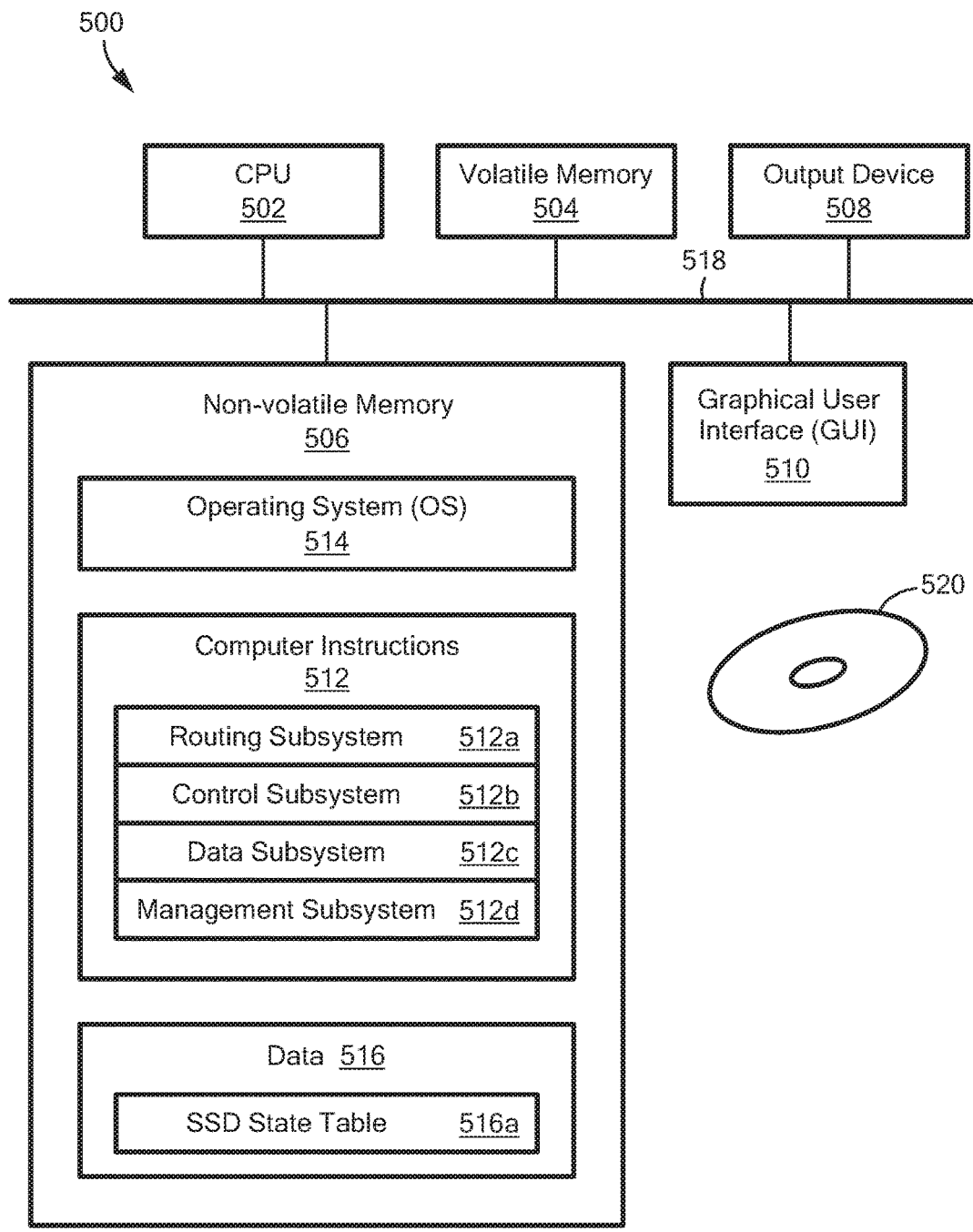
FIG. 5 is a schematic representation of an illustrative computer in accordance with an embodiment of the disclosure.

FIG. 5 shows an illustrative computer (e.g., physical or virtual) or other processing device 500 that can perform at least part of the processing described herein. In some embodiments, the computer 500 forms a part of a storage system, such as storage system 100 of FIG. 1. The computer 500 may include a processor 502, a volatile memory 504, a non-volatile memory 506 (e.g., hard disk or SSD), an output device 508 and a graphical user interface (GUI) 510 (e.g., a mouse, a keyboard, a display, for example), each of which is coupled together by a bus 518. The non-volatile memory 506 is configured to store computer instructions 512, an operating system 514, and data 516. In one embodiment, the computer instructions 512 are executed by the processor 502 out of volatile memory 504. In some embodiments, an article 520 comprises non-transitory computer-readable instructions.

In the embodiment shown, computer instructions 512 include routing subsystem instructions 512a that may correspond to an implementation of routing subsystem 102a (FIG. 1), control subsystem instructions 512b that may correspond to an implementation of control subsystem 102b, data subsystem instructions 512c that may correspond to an implementation of data subsystem 102c, and management subsystem instructions 512d that may correspond to an implementation of management subsystem 102d. As shown, in some embodiments, non-volatile memory 506 is configured to store an SSD state table 516a. On other embodiments, the SSD state table 516a may be stored in volatile memory 504.

Processing may be implemented in hardware, software, or a combination of the two. In various embodiments, processing is provided by computer programs executing on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as special purpose logic circuitry (e.g., an FPGA (field programmable gate array) and/or an ASIC (application-specific integrated circuit)).

All references cited herein are hereby incorporated herein by reference in their entirety.

Having described certain embodiments, which serve to illustrate various concepts, structures, and techniques sought to be protected herein, it will be apparent to those of ordinary skill in the art that other embodiments incorporating these concepts, structures, and techniques may be used. Elements of different embodiments described hereinabove may be combined to form other embodiments not specifically set forth above and, further, elements described in the context of a single embodiment may be provided separately or in any suitable sub-combination. Accordingly, it is submitted that scope of protection sought herein should not be limited to the described embodiments but rather should be limited only by the spirit and scope of the following claims.

What is claimed is:

1. A method comprising:
   performing a two-tier stage monitoring process of input/output (I/O) operations for a storage array, comprising:
   for a first tier of the two-tier stage monitoring process:
   detecting a timeout in response to performing an I/O operation against a first storage device in the storage array;
   updating a state of the first storage device, in a table maintained in the storage array, as temporarily unavailable, to reflect the timeout;
   performing a plurality of healthcheck I/O operations against the first storage device while the first storage device remains in the temporarily unavailable state, and simultaneously performing I/O operations, wherein the healthcheck I/O operations comprise read/write operations and are performed in the background; and
   upon determining a number of timeouts or errors occurring as a result of the healthcheck I/O operations exceed a predefined threshold, performing operations at a second tier of the two-tier stage monitoring process, the operations comprising at least one of:
   removing the first storage device from operation in the storage array and continuing the I/O operations on alternative storage devices in the storage array; and
   recovering data stored on the first storage device using other data and parity information stored on the alternative storage devices and writing the recovered data to at least one of the alternative storage devices within the storage array.

2. The method of claim 1 wherein the first storage device and the alternative storage devices comprise solid state drives (SSDs).

3. The method of claim 1 wherein performing a plurality of healthcheck I/O operations against the first storage device comprises performing periodic I/O operations against the first storage device over a predefined time interval;
   wherein the performing the healthcheck I/O operations while the first storage device is in the temporarily unavailable state includes monitoring results of the healthcheck I/O operations for a duration of the predefined time interval.

4. The method of claim 1 wherein upon determining the number of timeouts or errors occurring as a result of the performing do not exceed a predefined threshold, updating the state of the table to available, for the first storage device, if no timeouts or errors occur during the monitoring; otherwise, maintaining the state of the table to temporarily unavailable, for the first storage device;
   wherein, when the state of the table is updated to available, the method comprises resuming I/O operations on the first storage device; and
   when the state of the table is maintained at temporarily unavailable, the method comprises continuing healthcheck I/O operations while simultaneously performing I/O operations on the first storage device.

5. The method of claim 1 further comprising:
   in response to removing the first storage device from operation, commencing a rebuild process to recover data stored on the first storage device.

6. A method comprising:
   determining that a first I/O operation for an I/O request is associated with first data stored on a first storage device within a storage array;
   upon determining that the first storage device is temporarily unavailable due to a timeout,
   performing, as part of a first tier stage of a two-tier stage process, a plurality of healthcheck I/O operations against the first storage device, wherein the healthcheck I/O operations are read/write operations and are performed in the background; and
   marking the first storage device as available if the results of the healthcheck I/O operations are successful and exiting the first tier stage;
   marking the first storage device as faulty if the results of the plurality of healthcheck I/O operations performed against the first storage device are unsuccessful and entering a second tier stage of the two-tier stage process, the second tier stage including performing a degraded I/O operation against at least one of alternative storage devices within the storage array and recovering the first data from the degraded I/O operation.

7. The method of claim 6 further comprising:
   receiving a second I/O operation;
   determining to perform the second I/O operation against one of the alternative storage devices within the storage array in response to determining that the first storage device is temporarily unavailable; and
   performing the second I/O operation against the one of the alternative storage devices.

8. The method of claim 6 wherein marking the first storage device as faulty or available is based upon results of the plurality of I/O operations performed against the first storage device, the marking comprising:
   marking the first storage device as faulty if each of the plurality of healthcheck I/O operations performed against the first storage device fail; and
   marking the first storage device as available if at least one of the plurality of healthcheck I/O operations performed against the first storage device succeed.

9. The method of claim 6 further comprising:
in response to marking the first storage device as faulty, commencing a rebuild process to recover data stored on the first storage device.

10. The method of claim 6 wherein the storage array comprises a plurality of solid state drives (SSDs).

11. A system comprising:
a processor; and
a memory storing computer program code that when executed on the processor causes the processor to execute a process operable to perform the operations of:
performing a two-tier monitoring process of input/output (I/O) operations for a storage array, comprising:
for a first tier of the two-tier monitoring process:
detecting a timeout in response to performing an I/O operation against a first storage device in the storage array;
updating a state of the first storage device, in a table maintained in the storage array, as temporarily unavailable, to reflect the timeout;
performing a plurality of healthcheck I/O operations against the first storage device while the first storage device remains in the temporarily unavailable state, and simultaneously performing I/O operations, wherein the healthcheck I/O operations comprise read/write operations and are performed in the background; and
upon determining a number of timeouts or errors occurring as a result of the performing exceed a predefined threshold, performing operations at a second tier of the two-tier monitoring process, the operations comprising one of:
removing the first storage device from operation in the storage array and continuing the I/O operations on alternative storage devices in the storage array; and
recovering data stored on the first storage device using other data and parity information stored on the alternative storage devices and writing the recovered data to at least one of the alternative storage devices within the storage array.

12. The system of claim 11 wherein the storage array comprises a plurality of solid state drives (SSDs).

13. The system of claim 11 wherein the program code that when executed on the processor causes the processor to execute a process operable to perform a plurality of healthcheck I/O operations performed against the first storage device comprises performing periodic I/O operations against the first storage device over a predefined time interval;
wherein the performing the healthcheck I/O operations while the first storage device is in the temporarily unavailable state includes monitoring the healthcheck I/O operations for a duration of the predefined time interval.

14. The system of claim 11 wherein upon determining the number of timeouts or errors occurring as a result of the performing do not exceed a predefined threshold, the process operable to perform the operations include updating the state of the table to available, for the first storage device, if no timeouts or errors occur during the monitoring; otherwise, maintaining the state of the table to temporarily unavailable, for the first storage device;
wherein, when the state of the table is updated to available, the process operable to perform the operations comprises resuming I/O operations on the first storage device; and
when the state of the table is maintained at temporarily unavailable, the process operable to perform the operations comprises continuing healthcheck I/O operations while simultaneously performing I/O operations on the first storage device.

15. The system of claim 11 wherein the program code that when executed on the processor causes the processor to execute a process operable to perform the further operations of:
in response to removing the first storage device from operation, commence rebuild process to recover data stored on the first storage device.

16. The method according to claim 1, further comprising:
upon determining the timeout occurred when reading a particular offset in the first storage device, the healthcheck I/O operations include periodically reading from the same offset.

17. The method according to claim 1, further comprising:
upon determining the timeout occurred when writing to the first storage device, the healthcheck I/O operations include attempting to write to a reserved page within the first storage device.

18. The method of claim 6, wherein determining that a first I/O operation for an I/O request is associated with first data stored on a first storage device within a storage array is based on a content addressing scheme.

* * * * *